(12) United States Patent
Choi et al.

(10) Patent No.: US 9,735,159 B2
(45) Date of Patent: Aug. 15, 2017

(54) OPTIMIZED LAYOUT FOR RELAXED AND STRAINED LINER IN SINGLE STRESS LINER TECHNOLOGY

(71) Applicant: Texas Instruments Incorporated, Dallas, TX (US)

(72) Inventors: Younsung Choi, Plano, TX (US); Greg Charles Baldwin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/584,348

(22) Filed: Dec. 29, 2014

(65) Prior Publication Data

US 2015/0187772 A1    Jul. 2, 2015

Related U.S. Application Data

(60) Provisional application No. 61/921,742, filed on Dec. 30, 2013.

(51) Int. Cl.
*H01L 27/092*    (2006.01)
*H01L 29/78*    (2006.01)
*H01L 21/8238*    (2006.01)
*H01L 21/3115*    (2006.01)

(52) U.S. Cl.
CPC .... *H01L 27/0922* (2013.01); *H01L 21/82385* (2013.01); *H01L 29/7843* (2013.01); *H01L 21/31155* (2013.01)

(58) Field of Classification Search
CPC .......... H01L 27/0922; H01L 21/82385; H01L 29/7843; H01L 21/31155
See application file for complete search history.

(56) References Cited

U.S. PATENT DOCUMENTS

| | | | | |
|---|---|---|---|---|
| 9,520,398 B1* | 12/2016 | Ito | | H01L 27/0922 |
| 2007/0013010 A1* | 1/2007 | Wang | | H01L 29/41766 257/408 |
| 2007/0132034 A1* | 6/2007 | Curello | | H01L 21/76232 257/374 |
| 2008/0020591 A1* | 1/2008 | Balseanu | | C23C 16/345 438/761 |
| 2008/0124858 A1* | 5/2008 | Nguyen | | H01L 21/84 438/217 |
| 2012/0119301 A1* | 5/2012 | Choi | | H01L 21/823807 257/369 |
| 2015/0187772 A1* | 7/2015 | Choi | | H01L 27/0922 257/369 |

* cited by examiner

*Primary Examiner* — John P Dulka
(74) *Attorney, Agent, or Firm* — Jacqueline J. Garner; Charles A. Brill; Frank D. Cimino

(57) ABSTRACT

An integrated circuit and method with a single stress liner film and a stress relief implant where the distance of the stress relief implant to the transistors is adjusted for improved transistor performance.

20 Claims, 3 Drawing Sheets

US 9,735,159 B2

OPTIMIZED LAYOUT FOR RELAXED AND STRAINED LINER IN SINGLE STRESS LINER TECHNOLOGY

CROSS-REFERENCE TO RELATED APPLICATIONS

This application claims the benefit of priority under U.S.C. §119(e) of U.S. Provisional Application 61/921,742 (filed Dec. 30, 2013), the contents of which are hereby incorporated by reference.

FIELD OF THE INVENTION

This invention relates to the field of integrated circuits. More particularly, this invention relates to mobility enhancement in integrated circuit transistors.

BACKGROUND OF THE INVENTION

As technology scales, transistor performance is not improving accordingly. In order to increase transistor performance, various processes have been implemented to apply stress to the transistor channel region to enhance carrier mobility. Compressive stress enhances hole mobility when applied parallel to the current flow in a p-type metal-oxide-semiconductor (PMOS) transistor. One method to apply compressive stress in PMOS transistors is to remove silicon from the source and drain regions and replace it with epitaxially grown silicon germanium (SiGe). Another method is to deposit a compressive contact etch stop layer over the PMOS transistors.

For n-type metal-oxide-semiconductor (NMOS) transistors, applying tensile stress either perpendicular or parallel to the current flow enhances electron mobility. One method of applying tensile stress to the channel region in an NMOS transistor is to deposit a tensile contact etch stop layer over the NMOS transistor.

Dual stress liner (DSL) technology has been developed to deposit a compressive contact etch stop layer over the PMOS to enhance hole mobility and to deposit a tensile contact etch stop layer over the NMOS to enhance electron mobility. The DSL technology involves multiple depositions and patterning and etching steps to remove the tensile liner from PMOS areas and also to remove compressive liner from the NMOS areas. These additional steps add cost to the process flow.

To reduce cost on cost sensitive integrated circuits, single stress liner (SSL) technology may be employed. For example, a tensile etch stop liner may be deposited over both the NMOS and PMOS transistors. While this boosts the performance of the NMOS transistors, it degrades the performance of the PMOS transistors.

One method to reduce the detrimental effects of SSL is to add a pattern and implant stress reducing atoms. The implanted atoms cause implant damage in the stress film which reduces stress.

As is illustrated in FIG. 1, the usual practice is to use the nwell mask 110 to pattern the stress reduction implant. Typically the boundary 112 of the nwell implant mask 110 lies about midway between the NMOS (active 104 and gate 102) and PMOS (active 108 and gate 106) transistors. The nwell mask 110 is open over the PMOS transistor so the stress reduction implant reduces the stress of a tensile SSL layer over the PMOS transistor and reduces the detrimental effect tensile stress has on the PMOS transistor.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method with a single stress liner film and a stress relief implant where the distance of the stress relief implant to the transistors is adjusted for improved transistor performance.

DETAILED DESCRIPTION

Figure 2:
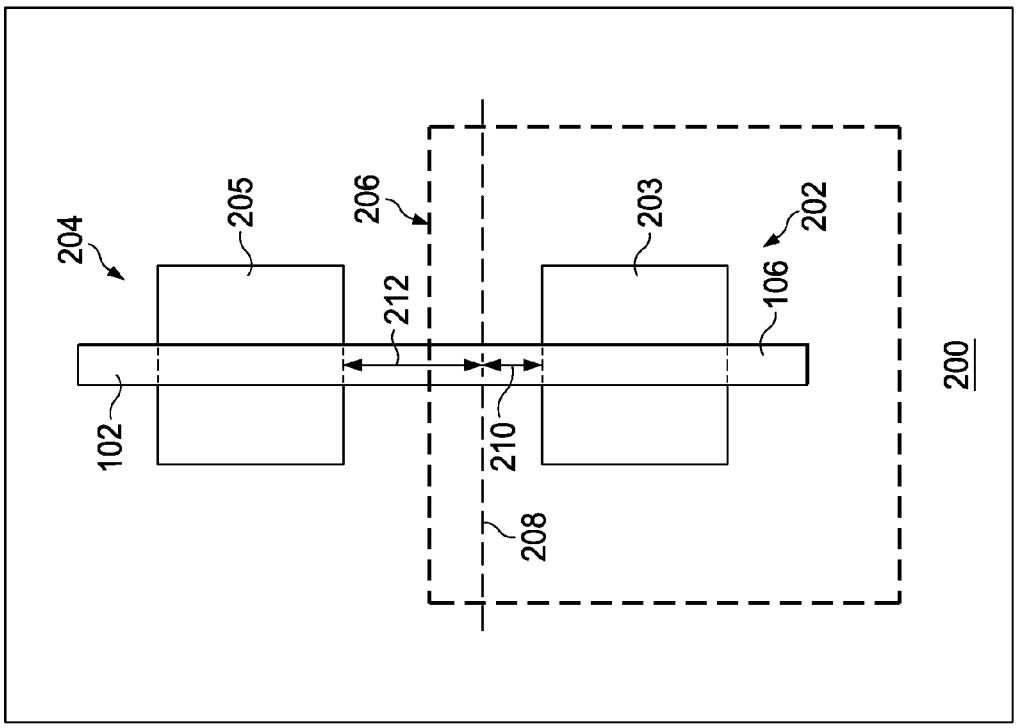
FIG. 2 is a top down view of the placement of a stress altering implant border with respect to an nwell/pwell border according to an embodiment.
Figure 1:
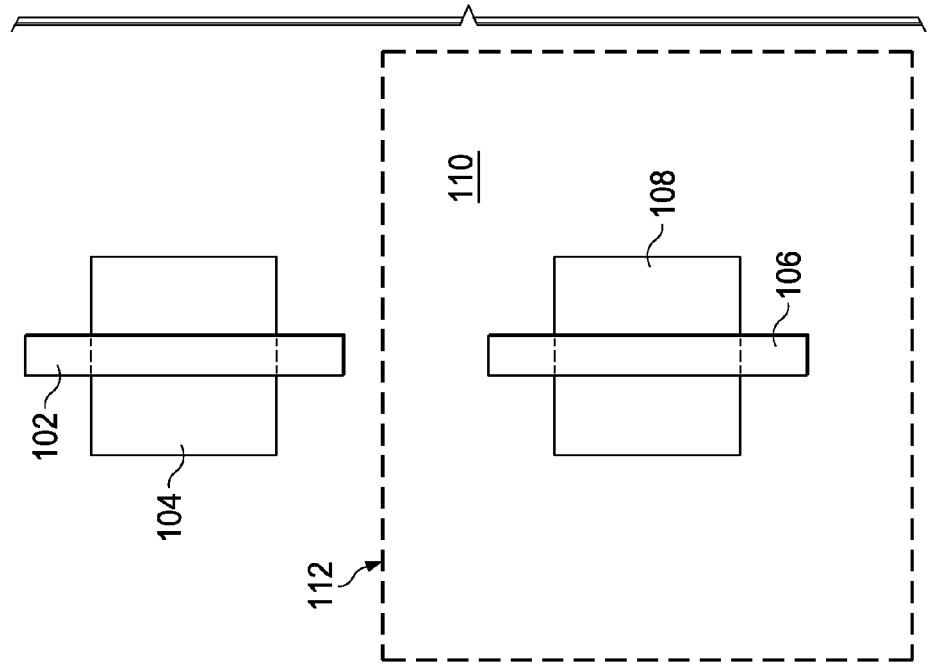
FIG. 1 (Prior Art) is a top down view of the placement of a stress altering implant border with respect to an nwell/pwell border.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The term "perpendicular boundary" refers to a boundary of a stress relief photo resist pattern or boundary of a stress relief implantation that is perpendicular to the gate of a transistor.

The term "parallel boundary" refers to a boundary of a stress relief photo resist pattern or boundary of a stress relief implantation that is parallel to the gate of a transistor.

A tensile stress enhancement layer to enhance NMOS performance with implant stress relaxation over the PMOS transistor to reduce degradation is used for illustration. A compressive stress enhancement layer to enhance PMOS performance with implant stress relaxation over the NMOS transistor to reduced degradation could also be used.

In FIG. 2, a single stress layer (SSL) 200 with tensile stress is deposited over both the NMOS 204 and PMOS 202 transistors. A stress relieving implant is used to reduce the stress in the SSL layer 200 over the PMOS transistor thus reducing the degradation of PMOS 202 performance. The stress relieving implant is blocked from the NMOS 204 transistor.

As shown in Table. 1, and in FIG. 2, the performance of PMOS 202 transistors improves as the distance 210 between the perpendicular boundary 208 of the stress relief implant and the PMOS 202 transistor active 203 is reduced. The stress relief implant boundary 208 lies between NMOS 204 transistor and PMOS 202 transistor. The PMOS 202 transistor is formed in nwell 206. As is shown in Table 1, in an embodiment example, as the distance 210 between the stress relief implant boundary 208 and the active 203 of the PMOS 202 transistor is reduced from 500 nm to 100 nm, the performance of the PMOS 202 transistor is improved from 1.5% to 8%.

As shown in Table 2, the performance of the NMOS 204 transistor is also improved as the stress relief implant boundary 208 is moved away from the NMOS 204 transistor active 205. The performance of an NMOS 204 transistor improves from −11% to −6.4% as the distance 212 of stress relief implant border from the NMOS active 205 increases from 100 nm to 500 nm. Moving the position of the perpendicular stress relief implant boundary 208 away from the NMOS 204 transistor active 205 and towards the PMOS 202 transistor active 203 improves the performance of both the NMOS 204 and PMOS 202 transistors.

TABLE 1

PMOS

| DSL border to P-active space perpendicular to gate | percent drive current gain |
|---|---|
| 50 nm | 3 |
| 100 nm | 8 |
| 150 nm | 7 |
| 200 nm | 6 |
| 250 nm | 5 |
| 300 nm | 4 |
| 350 nm | 3 |
| 400 nm | 2.5 |
| 450 nm | 2 |
| 500 nm | 1.5 |
| 5000 nm | 0 |

TABLE 2

NMOS

| DSL border to N-active space perpendicular to gate | percent drive current gain |
|---|---|
| 50 nm | −12 |
| 100 nm | −11 |
| 150 nm | −10 |
| 200 nm | −9.2 |
| 250 nm | −8.6 |
| 300 nm | −8.2 |
| 350 nm | −7.6 |
| 400 nm | −7.2 |
| 450 nm | −6.8 |
| 500 nm | −6.4 |
| >5000 nm | 0 |

Figure 3:
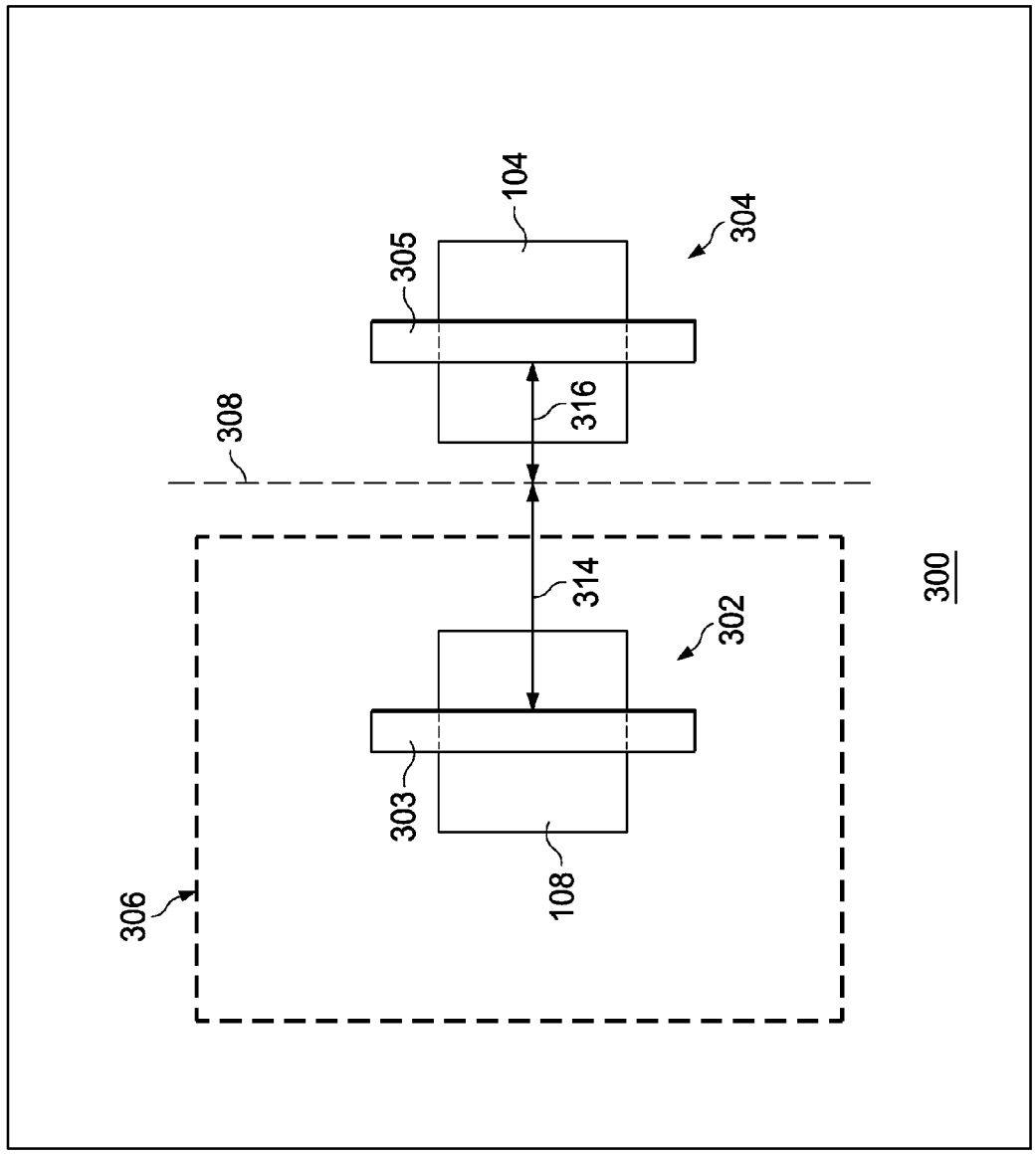
FIG. 3 is a top down view of the placement of a stress altering implant border with respect to an nwell/pwell border according to an embodiment.

In FIG. 3, a single stress layer (SSL) 300 with tensile stress is deposited over both the NMOS 304 and PMOS 302 transistors. Stress relieving atoms are implanted into the PMOS transistor 302 area to reduce the tensile stress and thus reduce degradation of PMOS transistor 302 performance. The stress relieving atoms are not implanted into NMOS transistor 304.

As is shown in FIG. 3 and Table 3, the performance of a PMOS 302 transistor is improved as the distance 314 between the parallel stress relief boundary 308 and the gate 303 of the PMOS 302 transistor increases. The parallel stress relief boundary 308 lies between NMOS 304 transistor and PMOS 302 transistor. The PMOS 302 transistor is formed in nwell 306. As shown in Table 3, in an example embodiment, as the distance 314 between the parallel stress relief boundary 308 and the PMOS transistor gate 303 is increased from 100 nm to 500 nm, the performance of the PMOS 302 transistor is improved from −33% to −7%.

As is shown in FIG. 3 and Table 4, as the distance 316 between the parallel stress relief boundary 308 and the gate 305 of the NMOS 304 transistor is increased from 100 nm to 500 nm, the performance of the NMOS 304 transistor improves from −4% to −2%. Since the performance of both the NMOS 304 and PMOS 302 transistors improves when the parallel stress relief boundary 308 is moved away a compromise between NMOS 304 transistor performance and PMOS 302 transistor performance may be made depending upon the requirements of the integrated circuit. Since the performance of the PMOS 302 transistor improves faster than the performance of the NMOS 304 transistor degrades as the parallel stress relief implant boundary 308 is moved away from the PMOS transistor gate 303 and towards the NMOS transistor gate 305, typically the distance 314 from the parallel stress relief boundary 308 to the PMOS transistor gate 303 is chosen to be greater than the distance 316 to the NMOS transistor gate 305.

TABLE 3

PMOS

| DSL border to P-active space parallel to gate | percent drive current gain |
|---|---|
| 50 nm | −35 |
| 100 nm | −33 |
| 150 nm | −23 |
| 200 nm | −15 |
| 250 nm | −12.5 |
| 300 nm | −11 |
| 350 nm | −10 |
| 400 nm | −9 |
| 450 nm | −8 |
| 500 nm | −7 |
| >5000 nm | 0 |

TABLE 4

NMOS

| DSL border to N-active space parallel to gate | percent drive current gain |
|---|---|
| 50 nm | −5 |
| 100 nm | −4 |
| 150 nm | −3.75 |
| 200 nm | −3.5 |
| 250 nm | −3.25 |
| 300 nm | −3 |
| 350 nm | −2.75 |
| 400 nm | −2.5 |
| 450 nm | −2.25 |
| 500 nm | −2 |
| >5000 nm | 0 |

Dual stress liner technology adds significant cost and complexity to a semiconductor manufacturing flow. For this reason, single stress liner (SSL) technology may be used to enhance the performance of one transistor type even though it degrades the performance of the opposite transistor type. To reduce the negative impact of SSL on the opposite transistor type, ion implantation may be used to damage the SSL and reduce the stress in the SSL film over the opposite transistor type. See for example U.S. Pat. No. 7,347,228 which teaches blanket deposition of a highly stressed film to enhance the performance of a first transistor type followed by the formation of a pattern to protect the first transistor type during implantation of the highly stressed film over the second transistor type. The implantation reduces the stress of the highly stress film over the second transistor type and thereby reducing degradation in performance of the second transistor type. It is typical to use the nwell mask for the stress implant mask.

As explained above the performance of a transistor may be affected by the proximity of a stress relief boundary to the transistor channel. In a first embodiment improvement in transistor performance may be realized in a SSL technology by moving the perpendicular stress relief implant boundary 208 closer to the PMOS transistor active 203 and farther away from the NMOS transistor active 205. Additional improvement in PMOS transistor performance may be realized by moving the parallel stress relief implant boundary 308 farther from the PMOS transistor gate 303 and closer to the NMOS transistor gate 305. In an example embodiment the distance 210 between the perpendicular stress relief implant boundary 208 and the active 203 of a PMOS 202 transistor is at least 50 nm less than the distance between the active 203 of the PMOS 202 transistor and the nwell boundary 206. In another example embodiment the distance 314 between the parallel stress relief implant boundary 308 and the gate 303 of the PMOS 302 transistor is at least 50 nm greater than the distance between the gate 303 of the PMOS 302 transistor and the nwell boundary 306.

Figure 4:
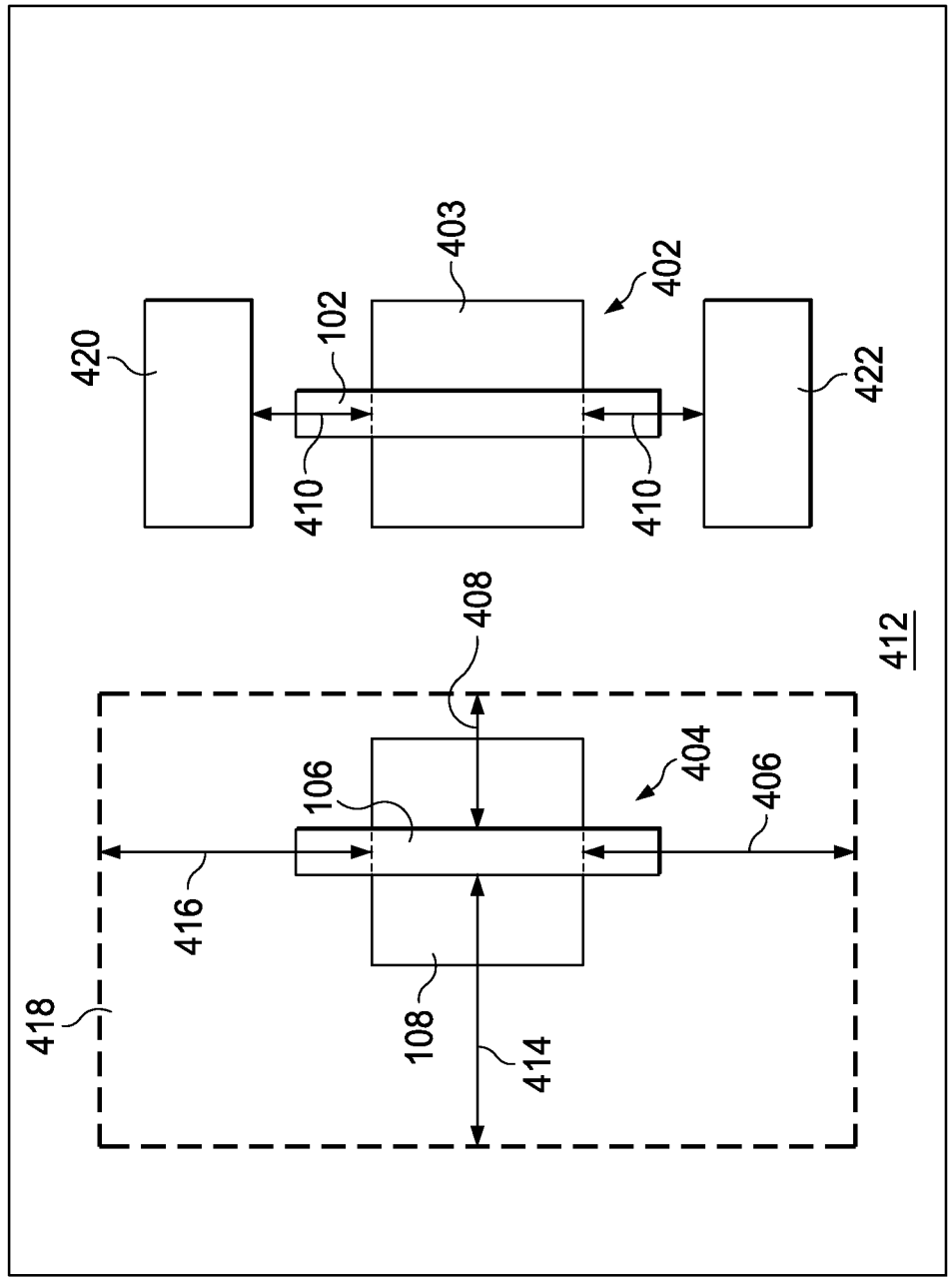
FIG. 4 is a top down view of the placement of a stress altering implant border with respect to an nwell/pwell border according to an embodiment.

FIG. 4 illustrates an embodiment where placement of perpendicular stress relief implantation mask geometries, 420 and 422 with respect to the transistor channel may be used to optimize the transistor performance in a SSL technology. To illustrate this embodiment, a tensile single stress liner film 412 is blanket deposited over both an NMOS 404 and PMOS 402 transistors. A stress relief implant pattern geometry 418, covers the NMOS transistor 404 blocking the implant from this area. The stress relief implant pattern also has perpendicular stress relief implant geometries, 420 and 422, on both sides of the PMOS transistor 402 perpendicular to the PMOS transistor gate 401 where the PMOS gate 401 steps off the PMOS active 403. The perpendicular stress relief implant blocking geometries 420 and 422 prevent the stress relief implant from damaging the stress film 412 and reducing the tensile stress in this area. The tensile stress from the perpendicular stress relief implant blocking geometries 420 and 422 enhances the performance of the PMOS 402 transistor.

The performance of the NMOS 404 transistor in FIG. 4 may be enhanced by increasing the distances between the NMOS 404 transistor and both the parallel 414 and 408 stress relief implant boundaries and the perpendicular 406 and 416 stress relief implant boundaries by as much as is allowed by neighboring devices.

Although this embodiment was illustrated using a tensile film 412 to enhance the NMOS 404 transistor, a compressive film to enhance PMOS 402 transistor performance may equally well be used. In this instance stress implant mask geometries 418, 420, and 422 would be clear allowing the stress relief implant into these areas. The PMOS 402 transistor would be protected by a stress relief implant blocking geometry. The NMOS 404 transistor area as well as the perpendicular stress relief implant geometries, 420 and 420 would be open to the stress relief implant to reduce compressive stress in these regions.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. An integrated circuit, comprising:
a PMOS transistor with a PMOS transistor active and a PMOS transistor gate in an nwell;
an NMOS transistor with an NMOS transistor active and an NMOS transistor gate;
a first portion of a single stress liner with a first stress overlying the NMOS transistor;
a second portion of the single stress liner with a second stress overlying the PMOS transistor wherein a boundary lies between the first portion and the second portion with a first distance from the boundary to the NMOS transistor active or the NMOS transistor gate and a second distance from the boundary to the PMOS transistor active of the PMOS transistor gate and wherein the difference between the first distance and the second distance is at least 50 nm, wherein one of the first portion and the second portion includes stress relief atoms and the other one does not, and wherein the boundary is an interface between the first or second portion with the stress relief atoms and the second or first portion without the stress relief atoms.

2. The integrated circuit of claim 1, wherein the boundary is perpendicular to the PMOS gate and wherein the first distance is a distance from the boundary to an active of the NMOS transistor and wherein the second distance is a distance from the boundary to an active of the PMOS transistor and wherein the first distance is at least 50 nm greater than the second distance.

3. The integrated circuit of claim 1, wherein the boundary is parallel to the PMOS gate and wherein the first distance is a distance from the boundary to a gate of the NMOS transistor and wherein the second distance is a distance from the boundary to a gate of the PMOS transistor and wherein the second distance is at least 50 nm greater than the first distance.

4. The integrated circuit of claim 1, wherein the single stress liner is a tensile stress layer and wherein the single stress liner is implanted with a stress relief implant over the PMOS transistor.

5. The integrated circuit of claim 1, wherein the single stress liner is a compressive single stress liner and wherein the single stress liner is implanted with a stress relief implant over the NMOS transistor.

6. The integrated circuit of claim 1, wherein the boundary is perpendicular to the gate and wherein first distance is greater than 100 nm and wherein the second distance is less than 50 nm.

7. A method of forming an integrated circuit, comprising:
forming a PMOS transistor with a PMOS active and a PMOS gate in an nwell;
forming an NMOS transistor with a NMOS active and a NMOS gate wherein the NMOS transistor and the PMOS transistor are adjacent to each other;
blanket depositing a single stress liner over the integrated circuit;
forming a stress relief implant photoresist pattern with a stress relief implant blocking geometry wherein an edge of the stress relief implant blocking geometry lies between the NMOS transistor and the PMOS transistor with a first distance from the edge to the NMOS transistor active or NMOS transistor gate and with a second distance from the edge to the PMOS transistor active or PMOS transistor gate and wherein a difference between the first and second distance is at least 50 nm; and
implanting stress relief atoms into the single stress liner to reduce stress in the single stress liner.

8. The method of claim 7, wherein said the single stress liner is a tensile stress film and the stress relief implant blocking geometry covers the NMOS transistor.

9. The method of claim 7, wherein said the single stress liner is a compressive single stress liner and the stress relief implant blocking geometry covers the PMOS transistor.

10. The method of claim 9, wherein the single stress liner is a tensile single stress liner and wherein the perpendicular stress blocking geometry blocks the stress relief implant.

11. The method of claim 9, wherein the single stress liner is a compressive single stress liner and wherein the perpendicular stress blocking geometry is open to the stress relief implant.

12. The method of claim 7, wherein the edge is a perpendicular edge and wherein the distance from the edge to the NMOS active is greater than 100 nm.

13. The method of claim 7, wherein the stress relief implant blocking geometry is a parallel stress blocking geometry and wherein second distance one is at least 50 nm greater than the first distance.

14. The method of claim 13, wherein the single stress liner is a tensile single stress liner and wherein the parallel stress blocking geometry blocks the stress relief implant.

15. The method of claim 13, wherein the single stress liner is a compressive single stress liner and wherein the parallel stress blocking geometry is open to the stress relief implant.

16. An integrated circuit, comprising:
a PMOS transistor in an nwell, the PMOS transistor having a PMOS gate and a PMOS active;
an NMOS transistor having an NMOS gate and a NMOS active;
a single stress liner extending over the PMOS transistor and the NMOS transistor, wherein the single stress liner includes a first portion and a second portion, wherein the second portion includes stress relief atoms, wherein an interface between the first portion without the stress relief atoms and the second portion with the stress relief atoms exists at a first distance from the NMOS transistor active and a second distance from the PMOS transistor active, and wherein a difference between the first distance and the second distance is at least 50 nm.

17. The integrated circuit of claim 16, wherein the interface is perpendicular to the PMOS gate and wherein the first distance is at least 50 nm greater than the second distance.

18. The integrated circuit of claim 17, wherein the first distance is greater than 100 nm and wherein the second distance is less than 50 nm.

19. The integrated circuit of claim 16, wherein the interface is parallel to the PMOS gate and wherein the second distance is at least 50 nm greater than the first distance.

20. The integrated circuit of claim 16, wherein the single stress liner is a tensile stress layer.

* * * * *